(12) United States Patent
Manley et al.

(10) Patent No.: US 6,221,735 B1
(45) Date of Patent: Apr. 24, 2001

(54) METHOD FOR ELIMINATING STRESS INDUCED DISLOCATIONS IN CMOS DEVICES

(75) Inventors: Martin Manley, Saratoga; Faran Nouri, Los Altos, both of CA (US)

(73) Assignee: Philips Semiconductors, Inc., Sunnyvale, CA (US)

( * ) Notice: Subject to any disclaimer, the term of this patent is extended or adjusted under 35 U.S.C. 154(b) by 0 days.

(21) Appl. No.: 09/504,991

(22) Filed: Feb. 15, 2000

(51) Int. Cl.$^7$ .................................................. H01L 21/76
(52) U.S. Cl. .......................... 438/426; 438/436; 438/437; 438/424; 438/425
(58) Field of Search ..................................... 438/795, 426, 438/436, 437, 424, 300, 435, 296, 431, 425; 257/510

(56) References Cited

U.S. PATENT DOCUMENTS

| | | | |
|---|---|---|---|
| 5,516,721 | * 5/1996 | Galli et al. | 437/67 |
| 5,719,085 | * 2/1998 | Moon et al. | 438/424 |
| 5,811,347 | * 9/1998 | Gardner et al. | 438/435 |
| 5,882,982 | 3/1999 | Zheng et al. | 438/424 |
| 5,915,183 | * 6/1999 | Gambino et al. | 438/300 |
| 5,933,748 | * 8/1999 | Chou et al. | 438/431 |
| 5,994,756 | * 11/1999 | Umezawa et al. | 257/510 |
| 6,037,238 | * 3/2000 | Chang et al. | 438/426 |

OTHER PUBLICATIONS

"Stress–induced dislocations in silicon integrated circuits". P.M. Fahey et al., IBM J. Fes.Develop. vol. 36No. 2, Mar. 1992.

"Stress Analysis of Shallow Trench Isolation for 256K–DRAM and beyond". T. Kuroi et al., IEDM 1998.

"Characterization and Elimination of Trench Dislocations". J. Damiano et al., VLSI Symposium 1998.

"Modeling of Cumulative Thermo–Mechanical Stress (CTMS) Produced by the Shallow Trench Isolation Process for 1 Gb DRAM and beyond". Kim et al., IEDM 1998.

"NMOS Drive Current Reduction Caused by Transistor Layout and Trench Isolation Induced Stress." (G. Scott, J. Lutze, M. Rubin, F. Nouri, and M. Manley, IEDM Technical Digest, 1999, pp. 827–830.).

A New Leakage Component Caused by the Interaction of Residual Stress and the Relative Position of Poly–Si Gate at Isolation Edge. H. Lee et al., IEDM 1995.

* cited by examiner

Primary Examiner—Matthew Smith
Assistant Examiner—V. Yevsikov
(74) Attorney, Agent, or Firm—Crawford PLLC

(57) ABSTRACT

The stress dislocations formed in a substrate by semiconductor processing are significantly reduced, if not eliminated, by subjecting the substrate to a high temperature post sacrificial oxide anneal that causes viscous flow of the oxide over the substrate. In one example embodiment, a method of forming a semiconductor structure includes forming a first oxide layer over a substrate and forming a first dielectric material layer over the first oxide layer. An opening is then etched in the oxide and dielectric layers thereby exposing the substrate. A trench is formed with a desired depth in the substrate in the opening provided, followed by a deposition of an insulator material in the trench. The first dielectric layer and a portion of the insulator material is then removed leaving a portion of the insulator material within the trench. Applications include logic circuits having embedded-DRAM and circuits directed to stand-alone logic or stand-alone DRAM.

15 Claims, 3 Drawing Sheets

METHOD FOR ELIMINATING STRESS INDUCED DISLOCATIONS IN CMOS DEVICES

FIELD OF THE INVENTION

The present invention relates generally to semiconductor devices and their fabrication and, more particularly, to reducing stress-induced dislocations in semiconductor devices and improving their performance.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors and the like.

Each of these semiconductor devices generally includes a semiconductor substrate on which a number of active devices are formed. The particular structure of a given active device can vary between device types. For example, in MOS transistors, an active device generally includes source and drain regions and a gate electrode that controls the current in the channel between the source and drain regions.

For proper operation of the MOS device, current should not flow between the source and drain regions of one MOS-type transistor to that of another transistor. During the manufacturing process, however, movement of dopant atoms, such as boron, can occur in the form of diffusion within the solid silicon of the wafer. The diffusion process occurs at elevated temperatures where there is a concentration gradient between dopant atoms external to the silicon wafer and dopant atoms diffusing into the silicon wafer and is typical in connection with forming p-type and n-type regions of a silicon integrated circuit device. Therefore, one important step in the manufacture of such devices is the formation of isolation areas to electrically separate the MOS devices.

Local oxidation of silicon (LOCOS) and shallow trench isolation (STI) are techniques that have been used in the past to limit diffusion in the silicon and to limit leakage current. STI has the advantage of allowing for higher device density by decreasing the required width of the semiconductor device isolating structure and can enhance surface planarity, thereby considerably improving critical dimension control during the lithographic process. One of the disadvantages of STI is the formation of sharp corners at the interface of the vertically oriented sidewalls and the top surface of the substrate. In efforts to round these sharp corners, the STI process has been further complicated, resulting in increased cost, decreased throughput and reduced yields.

Many processes used in the fabrication of integrated circuits generate stress in the silicon substrate. Given enough stress, the substrate will yield by forming dislocations that can glide into device regions. Shallow trench isolation processes are known to generate high stress in the silicon substrate. In the STI process, the subsequent oxidation (which generates self-interstitials) and implantation (which generates point defects) can contribute to nucleation of dislocations. Several methods have been developed to minimize the dislocations, including changes to the layout of the device, significant changes to the etch process, changes to the ion implantation process and changes to the annealing of the ion implant damage. High temperature corner oxidation cycles prior to the removal of an overlying nitride layer have typically been used to prevent dislocations, but this approach has not been totally satisfactory and is complicated to implement.

Accordingly, a need exists for developing a method for manufacturing semiconductor devices on semiconductor substrates that addresses the above-mentioned concerns and reduces stress-induced dislocations in the silicon substrate while increasing production yields.

SUMMARY OF THE INVENTION

The present invention is exemplified in a number of implementations and applications, some of which are summarized below. One of the advantages of the present invention is the ease of incorporation of the method of eliminating stress induced dislocations in a substrate into current semiconductor fabrication processes. According to one embodiment, a method of forming a semiconductor structure is described that includes forming a first oxide layer over a substrate and forming a first dielectric material layer, typically silicon nitride, over the first oxide layer. An opening is then etched in the oxide and dielectric layers thereby exposing the substrate. A trench is formed with a desired depth in the substrate within the opening provided, followed by deposition of an insulator material in the trench. The first dielectric layer and a portion of the insulator material are then removed, leaving a portion of the insulator material within the trench. The substrate is thereafter subjected to a high temperature post-sacrificial oxide anneal that promotes viscous flow of the oxide and reduces dislocations in the substrate.

The anneal should preferably be performed after the removal of any overlying nitride layer and prior to the implantation of channel implants. In connection with the present invention, it has been discovered that anneals performed while the overlying nitride layer is still in situ gives rise to only a partial relief of silicon stress; much better stress relief can be obtained by performing the anneal after the nitride layer has been removed.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
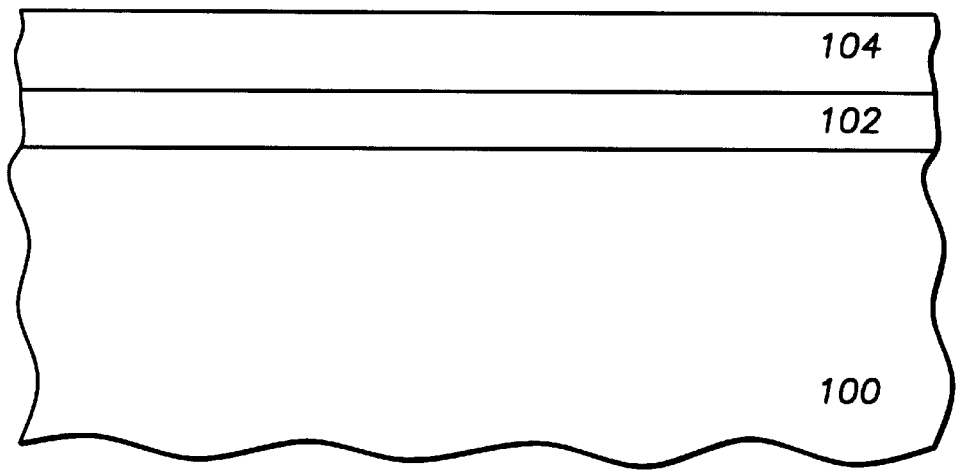
FIG. 1A is a cross-sectional view of a prior art semiconductor structure that includes an oxide layer and a dielectric layer formed on a substrate.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention has been found to be advantageous in applications where it is desirable to limit or eliminate the effects of stress induced dislocations in the silicon substrate caused by subjecting the silicon substrate to different manufacturing processes. The present invention has been found to be particularly advantageous when used in connection with STI processes to improve the yield and reduce the cost of manufacturing CMOS devices. The stress reduction is also shown to improve the device performance, for example, in connection with drain saturation current. Unrelieved stress associated with the trench process reduces transistor drain current of NMOS transistors due to a lowering of the electron mobility, as discussed in connection with "NMOS Drive Current Reduction Caused by Transistor Layout and Trench Isolation Induced Stress." (G. Scott, J. Lutze, M. Rubin, F. Nouri and M. Manley, IEDM Technical Digest, 1999, pp. 827–830.) While the present invention is not necessarily limited to these environments, an appreciation of various aspects of the invention is best gained through a discussion of example processes used to form such semiconductor structures and devices.

In one example application of the present invention, stress induced dislocations formed in a silicon substrate by an STI process are reduced by subjecting the substrate, which has an oxide layer disposed thereon, to a high temperature post-sacrificial oxide anneal. The annealing step is performed after trench formation and the removal of any dielectric layer disposed on top of the oxide layer but prior to implanting ions into the substrate. Another example application includes incorporating this process in a LOCOS formation process, where there is also a concern that stress induced dislocations may result from LOCOS formation.

Figure 1B:
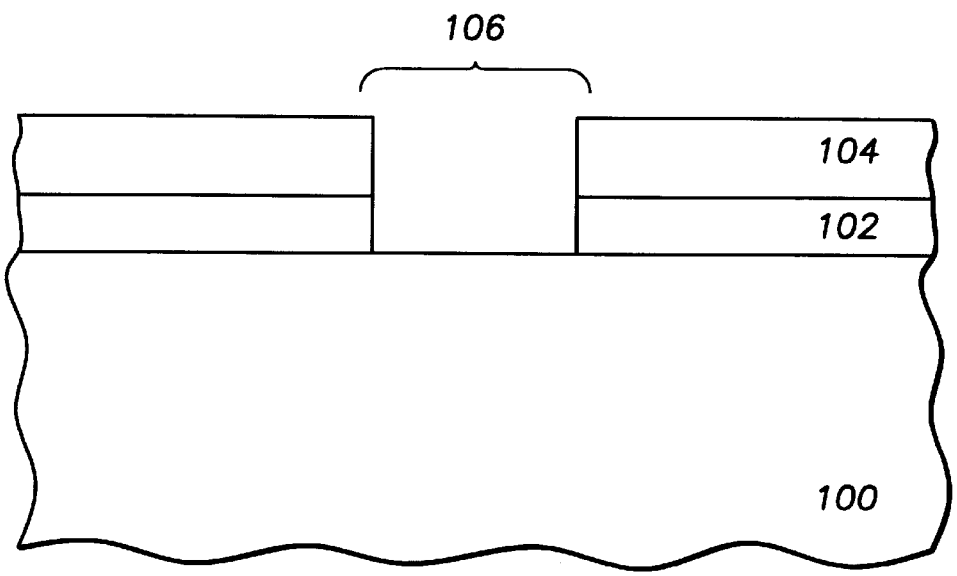
FIG. 1B is a cross-sectional view of the prior art semiconductor structure of FIG. 1A with an opening exposing the substrate.

Referring now to FIG. 1A, a semiconductor structure has a substrate 100 that has an oxide layer 102 with a nitride layer 104 formed thereon. Oxide 102 and nitride 104 are used to mask underlying semiconductor substrate 100 during subsequent processing steps. Referring to FIG. 1B, an STI process is used to form an opening 106 extending through oxide layer 102 and nitride layer 104 to the top surface of substrate 100. An example of a trench isolation method is disclosed in U.S. Pat. No. 5,882,982 to Zheng, which is herein incorporated by reference.

Figure 1C:
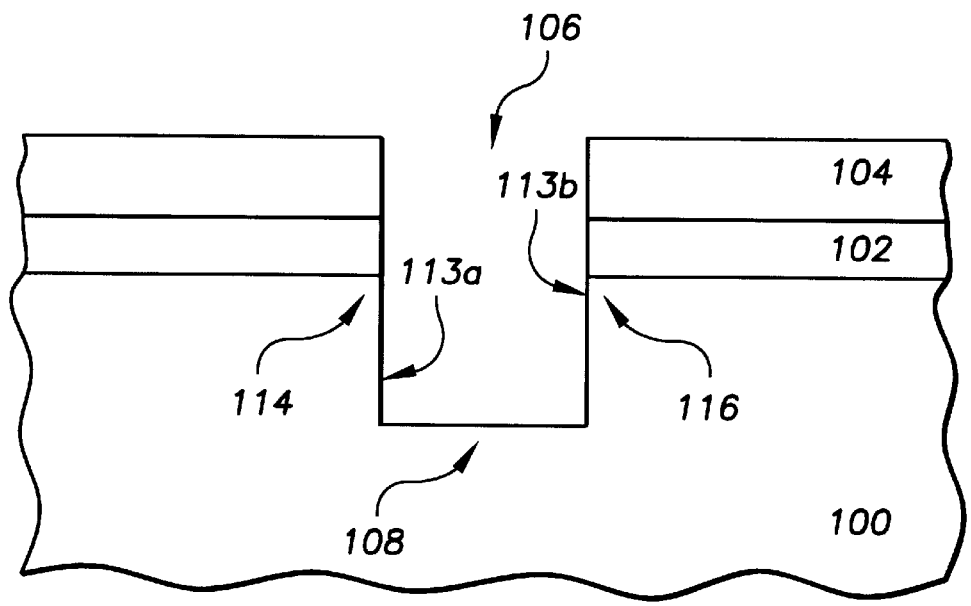
FIG. 1C is a cross-sectional view of a prior art semiconductor structure that has a trench formed in the substrate.

Referring to FIG. 1C, a plasma etch or other type of dry etch is then used to etch an opening or trench 108 into substrate 100. A common etching chemistry of chlorine and hydrogen bromide ($Cl_2HBr$) is used to etch trench 108 into the substrate. Trench 108 has a vertical sidewall profile, with sidewalls 113a and 113b, as shown in FIG. 1C. This type of trench construction is known to produce sharp corners, such as corners 114 and 116, at the interface of vertically oriented sidewalls 113a and 113b and the top surface of semiconductor substrate 100. As a result, stress in the contact area between subsequently deposited dielectric material (or other semiconductor material) and semiconductor substrate 100 is generated at sharp corners 114 and 116. Sharp corners 114 and 116 and resultant stresses contribute to poor leakage protection and poor gate oxide integrity.

Figure 1D:
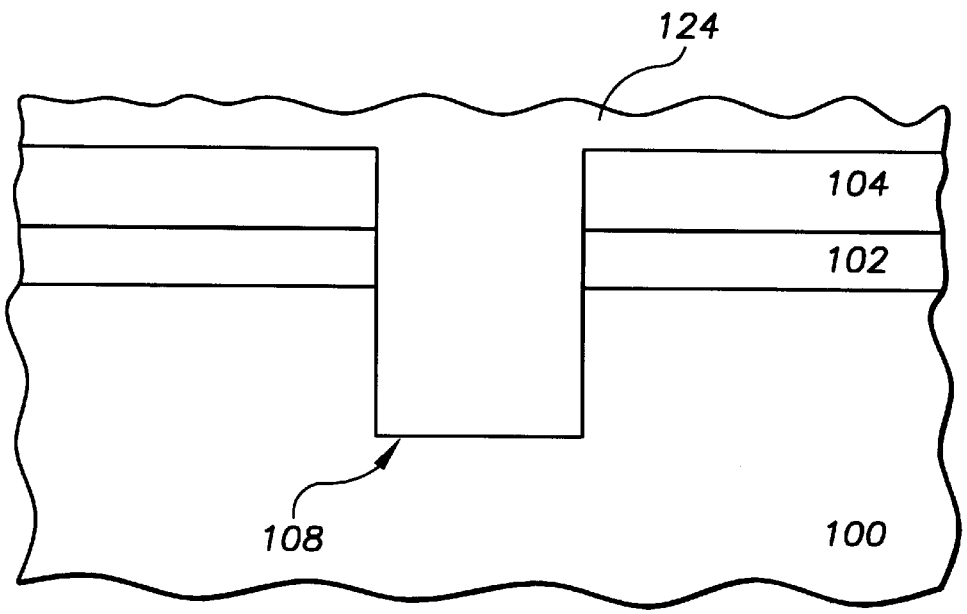
FIG. 1D is a cross-sectional view of prior art semiconductor structure that has the trench filled and the substrate covered with an insulator material.

With reference next to FIG. 1D, there is shown the semiconductor structure after the deposition of dielectric material 124 in trench 108 and on nitride layer 104. Excess dielectric material 124 is then removed. Depending on the type of semiconductor structure being formed it is possible to fill trench 108 with one of various types of materials used to form semiconductor devices. The dielectric material in this example embodiment is silicon dioxide, but could also be silicon oxynitride.

Figure 1E:
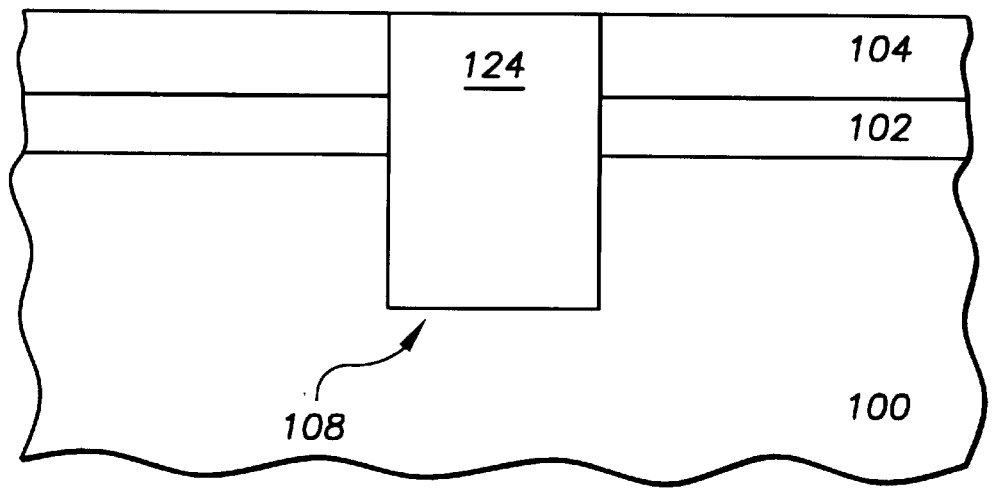
FIG. 1E is a cross-sectional view of a semiconductor structure that has had the insulator layer planarized.

As shown in FIG. 1E, excess dielectric material 124 is removed using a chemical mechanical polishing (CMP) process. The top surface of nitride layer 104 acts as a stop for the CMP process. Thus, the top surface of dielectric material 124 deposited into trench 108 is coplanar with the top surface of nitride layer 104. Although a CMP process is used to remove the excess dielectric material in the present embodiment, the present invention is also well suited to using various other methods to remove the excess dielectric material or semiconductor material.

Figure 1F:
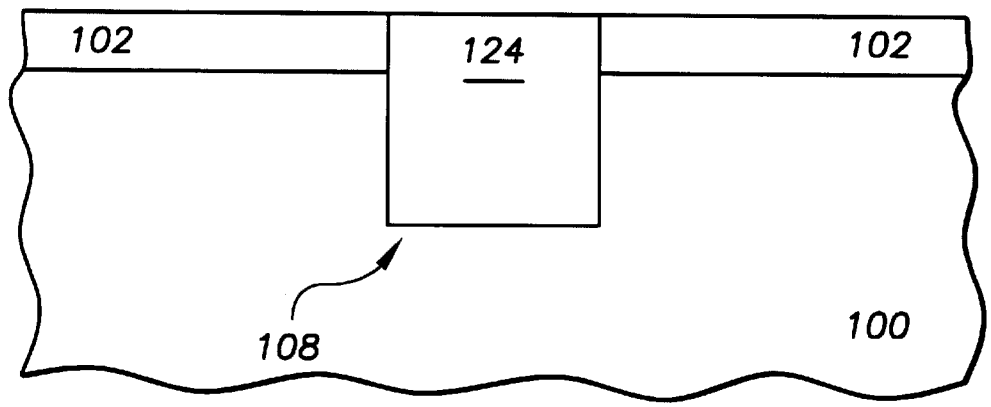
FIG. 1F is a cross-sectional view of the example semiconductor structure of FIG. 1E that is subjected to high temperature annealing according to the teachings of the present invention.

Referring now to FIG. 1F, a cross-sectional view of the semiconductor structure is shown with nitride layer 104 removed and a portion of material 124 removed. The remaining portion of material 124 is coplanar with oxide layer 102 and serves to isolate adjacent devices on the substrate. The semiconductor structure is then subjected to a high temperature sacrificial oxide annealing, in accordance with the teachings of the present invention. In one example embodiment, the semiconductor structure is then thermally annealed, for example, at 1075° C. for one hour. The high temperature allows the viscous flow of the oxide material on the substrate and relieves stresses in the silicon substrate. The high temperature anneal step is performed prior to any implantation steps to minimize any impact on semiconductor devices that are being formed. The annealing step is specifically added after STI processing, in this example, and after the nitride layer is removed to maximize the stress relief in the silicon substrate. This annealing step has the advantage of dramatically increasing yield of devices being manufactured. Moreover, stress reduction has also been shown to improve device performance (improves Idsat). The process taught herein is particularly advantageous when used in connection with the fabrication of CMOS devices.

In another example embodiment, the semiconductor structure of FIG. 1D is formed by omitting nitride layer 104 and using a photoresist mask in place of the nitride layer that is formed over oxide layer 102. The mask would protect oxide layer 102 during formation of opening 106 and formation of trench 108 in the substrate. The mask is removed prior to deposition of an insulator material 124 into trench 108 and on the surface of oxide layer 102. The uppermost portion of insulator material 124 is removed from above the oxide layer and the top of the trench to leave the insulator material within the trench coplanar with the oxide layer, as in FIG. 1F. As in the example above, the substrate is then subjected to a high temperature post-sacrificial oxide anneal before further processing is continued.

Once the annealing process has been completed for this step of the semiconductor structure formation, it is possible to form semiconductor devices adjacent the trench structure. If a gate structure is formed on substrate 100, then source and drain regions can be formed in the substrate bounded by isolation regions. If a DRAM cell is to be formed, a capacitor can be formed within the trench adjacent the DRAM device.

While the present invention has been described with reference to several particular example embodiments, those skilled in the art will recognize that many changes may be made thereto without departing from the spirit and scope of the present invention, which is set forth in the following claims.

What is claimed is:

1. A method of forming a semiconductor structure, comprising the steps of:
    forming a first oxide layer over a substrate;
    forming a first dielectric material layer over the first oxide layer;
    using the first dielectric material to protect underlying substrate, etching an opening in the oxide and dielectric layers thereby exposing the substrate and vertical surfaces of the oxide and dielectric layers;
    forming a trench of a desired depth in the substrate in the opening and depositing an insulator material in the trench;
    removing the first dielectric layer and a portion of the insulator material thereby leaving a portion of the insulator material within the trench; and
    subjecting the substrate to a high temperature post sacrificial oxide anneal, the temperature being sufficiently high to cause viscous flow of the oxide and reduce dislocations in the substrate.

2. The method of forming a semiconductor structure, as recited in claim 1, further including the step of:
    removing excess insulator material such that the semiconductor material is substantially coplanar with a top surface of the oxide layer.

3. The method of forming a semiconductor structure, as recited in claim 1, wherein the first dielectric material is silicon nitride.

4. The method of forming a semiconductor structure, as recited in claim 1, further including the step of forming a semiconductor device adjacent the trench.

5. The method of forming a semiconductor structure, as recited in claim 4, further including forming a gate region and doped source and drain regions in the substrate.

6. The method of forming a semiconductor structure, as recited in claim 1, wherein the insulator material is silicon dioxide.

7. A method of forming a semiconductor structure, comprising the steps of:
    forming a first oxide layer over a substrate;
    forming a mask over the first oxide layer;
    using the mask to protect underling substrate, etching an opening in the oxide thereby exposing the substrate and vertical surface of the oxide layer;
    forming a trench of a desired depth in the substrate in the opening;
    removing the mask and depositing an insulator material in the trench and on the oxide layer;
    removing a portion of the insulator material thereby leaving a portion of the insulator material within the trench; and
    subjecting the substrate to a high temperature post sacrificial oxide anneal, the temperature being sufficiently high to cause viscous flow of the oxide and reduce dislocations in the substrate.

8. The method of forming a semiconductor structure, as recited in claim 7, further including the step of removing excess insulator material such that the insulator material is substantially coplanar with a top surface of the oxide layer.

9. The method of forming a semiconductor structure, as recited in claim 7, wherein the insulator material is silicon dioxide.

10. The method of forming a semiconductor structure, as recited in claim 7, further including the step of forming a semiconductor device adjacent the trench.

11. The method of forming a semiconductor structure, as recited in claim 10, further including DRAM cells constructed using a polysilicon gate structure.

12. The method of forming a semiconductor structure, as recited in claim 10, further including logic circuits constructed using a polysilicon gate structure.

13. The method of forming a semiconductor structure, as recited in claim 10, further including both logic circuits and DRAM circuits constructed using a polysilicon gate structure.

14. The method of forming a semiconductor structure, as recited in claim 10, further including forming a gate region and doped source and drain regions in the substrate.

15. The method of claim 7, wherein the high temperature annealing step includes a temperature exceeding 1000° C. for at least about one hour.

* * * * *